US012730958B1

(12) United States Patent
Uysal et al.

(10) Patent No.: US 12,730,958 B1
(45) Date of Patent: Sep. 8, 2026

(54) NON-CRITICAL CHILD NODE-BASED INSERTION DELAY OPTIMIZATION IN CIRCUIT DESIGN

(71) Applicant: Cadence Design Systems, Inc., San Jose, CA (US)

(72) Inventors: Necati Uysal, Austin, TX (US); Sheiny Fabre Almeida, Sao Jose (BR); Natarajan Viswanathan, Austin, TX (US); Charles Jay Alpert, Cedar Park, TX (US); Amin Farshidi, Austin, TX (US)

(73) Assignee: Cadence Design Systems, Inc., San Jose, CA (US)

( * ) Notice: Subject to any disclaimer, the term of this patent is extended or adjusted under 35 U.S.C. 154(b) by 577 days.

(21) Appl. No.: 18/242,974

(22) Filed: Sep. 6, 2023

(51) Int. Cl.

| | |
|---|---|
| ***G06F 30/30*** | (2020.01) |
| ***G06F 30/396*** | (2020.01) |
| ***G06F 30/398*** | (2020.01) |

(52) U.S. Cl.
CPC .......... *G06F 30/396* (2020.01); *G06F 30/398* (2020.01)

(58) Field of Classification Search
USPC ................................ 716/101, 108, 113, 132
See application file for complete search history.

(56) References Cited

U.S. PATENT DOCUMENTS

| | | | | |
|---|---|---|---|---|
| 6,698,006 | B1 * | 2/2004 | Srinivasan | G06F 1/10 716/122 |
| 7,559,040 | B1 * | 7/2009 | Albrecht | G06F 30/327 716/132 |
| 10,534,883 | B1 * | 1/2020 | Bai | G06F 30/327 |
| 2005/0050497 | A1 * | 3/2005 | Tetelbaum | G06F 30/392 716/113 |
| 2007/0164785 | A1 * | 7/2007 | He | G06F 30/34 326/41 |

* cited by examiner

*Primary Examiner* — Brian Ngo
(74) *Attorney, Agent, or Firm* — Schwegman Lundberg & Woessner, P.A.

(57) ABSTRACT

Various embodiments provide for optimizing (e.g., reducing) insertion delay in a circuit design based on one or more non-critical child nodes of a critical node of a routing tree, which can be performed by an electronic design automation (EDA) software to optimize (e.g., reduce) insertion delay in a clock tree of a circuit design.

20 Claims, 10 Drawing Sheets

NON-CRITICAL CHILD NODE-BASED INSERTION DELAY OPTIMIZATION IN CIRCUIT DESIGN

TECHNICAL FIELD

Embodiments described herein relate to circuit design and, more particularly, to systems, methods, devices, and instructions for optimizing insertion delay in a circuit design based on one or more non-critical child nodes of a critical node of a routing tree, which can be performed by an electronic design automation (EDA) software to optimize insertion delay in a clock tree of a circuit design.

BACKGROUND

Electronic design automation (EDA) software systems commonly perform insertion delay (ID) optimization of a circuit design (for a physical circuit) to ensure that signals propagate through the circuit design according to one or more timing constraints. Traditional techniques for insertion delay optimization include, without limitation, inverter/buffer insertion, delay insertion, gate sizing, or some combination thereof.

BRIEF DESCRIPTION OF THE DRAWINGS

Various ones of the appended drawings merely illustrate various embodiments of the present disclosure and should not be considered as limiting its scope.

DETAILED DESCRIPTION

Figure 1:
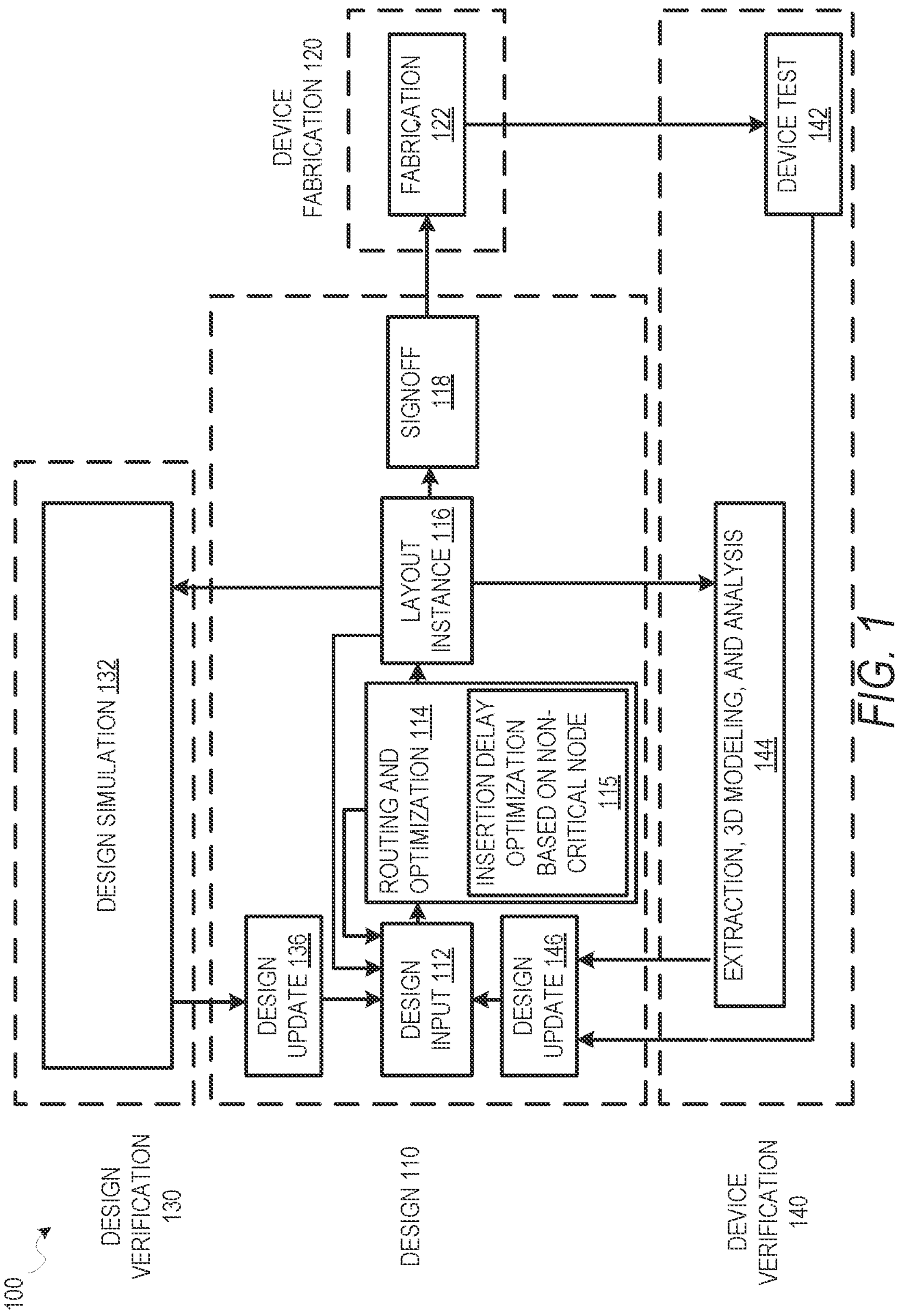
FIG. 1 is a diagram illustrating an example design process flow for optimizing insertion delay in a circuit design based on one or more non-critical child nodes of a critical node of a routing tree, according to some embodiments.

Generally, a generated clock (distribution) network or a clock tree comprises a branching network of fan-out buffers or fan-out inverters to distribute a clock signal from a root clock signal source (clock source) to a set of clock pins of clocked circuit elements within the circuit design (clock endpoints or clock sinks). A clock node can refer to a point in the clock tree where a clock signal is received (e.g., by a clock sink) or distributed. A node of a clock network can comprise a buffer, an inverter, or a logic gate in the path from a clock source to a clock pin, such as a clock-gate or integrated clock gate (ICG), where the logic gate can be used to block a clock edge from reaching the clock pin and logic paths (thereby turning off the clock pin and logic paths) they contribute to. This is often referred to as clock gating the circuit element. For example, a final circuit resulting from a given circuit design can use a clock gate to turn off a cluster (or group) of clock pins (also referred to as a clock gate cluster or clock gate group (e.g., ICG group)) under certain conditions, such as when the cluster is not required for certain operations of the final circuit for the active operation of the IC. The basic clock gating topology of a clock network is defined during CTS.

At present, traditional insertion delay optimization techniques focus on optimizing critical drivers (e.g., buffers or drivers) of a routing tree of a circuit design, such as a clock tree. As a result, traditional insertion delay optimization techniques are often limited to a small solution space for identifying optimizations, which may not be sufficient to meet the insertion delay targets/constraints of a circuit design.

Various embodiments described herein cure these and other deficiencies of traditional insertion delay optimization. In particular, various embodiments provide for optimizing (e.g., reducing) insertion delay (ID) in a routing tree (e.g., clock tree) of a circuit design. For some embodiments, insertion delay in the routing tree is optimized by using a compound, child node (e.g., fanout node or fanout) transform that demotes one or more non-critical child nodes (e.g., drivers) of a critical node (e.g., driver) to improve the insertion delay of the critical node. For some embodiments, the child node transform comprises (e.g., simultaneously) performing a set of moving operations, a set of downsizing (e.g., downward rescaling) operations, or both on one or more (e.g., all) non-critical nodes (e.g., drivers) of a critical node such that a load (e.g., capacitive load) driven by the critical node is reduced. As a transform of various embodiments reduces a load driven by a critical node, the transform helps increase a success rate of (e.g., achieving insertion delay improvements by) one or more subsequent transforms, such as resizing and cloning. For various embodiments, multiple optimization iterations/transforms are performed on multiple child nodes at the same time, thereby providing better convergence of insertion delay (ID) reduction.

As used herein, a routing tree of a circuit design can comprise two or more nodes. For instance, a routing tree of a circuit design can comprise a clock tree of the circuit design. a clock network or a clock tree comprises a branching network (e.g., of drivers) to distribute a clock signal from a source node, which is coupled to a clock signal source within a circuit design, to a plurality of sink nodes, which is coupled to clocked circuit elements (or clock sinks)

within the circuit design. A clocked circuit element usually comprises a circuit device in the circuit design that is designed to be clocked and thus needs a clock signal to operate. Examples of clocked circuit elements include, without limitations, flip-flops or other sequential circuit devices that rely on a clock signal to synchronize their operations. A clocked circuit element can receive a clock signal via a clock pin included by the clocked circuit element.

As used herein, a node of a routing tree can comprise a logic gate (or gate) or a cell of a circuit design. For instance, a node (or a clock node) of a clock tree can comprise a logic gate (e.g., clock gate) or a driver, which can comprise a buffer or an inverter. A clock tree can include one or more drivers (e.g., buffers and inverters) to relay and maintain the integrity of a clock signal being distributed within the clock tree, and can help address delay issues within the clock tree (e.g., clock signal within the clock tree not meeting clock skew targets).

As used herein, an insertion delay (ID) can refer to a signal propagation delay along a path in a circuit design. An insertion delay can be impacted by the length (e.g., wirelength) of a path (e.g., wire). Typically, the longer the length of a path, the more the insertion delay of the path. A clock insertion delay can comprise a delay of a clock signal as it travels through a clock tree from a clock source to various clock sinks (e.g., flip-flops) of a circuit design. As used herein, a critical time path (or critical path) can refer to a longest path in a circuit design (e.g., a clock tree) from a signal input (e.g., clock source) to a signal output (e.g., clock node). A critical node (e.g., critical clock node) is a node (e.g., in a clock tree) that is on a critical path, while a non-critical node (e.g., non-critical clock node) is a node not on a non-critical path.

As used herein, a load (e.g., driven load or fanout load) of a node of a routing tree, such a critical node, can comprise a capacitive load of the node by one or more child nodes (e.g., fanout nodes, or fanouts) that are coupled to an output (e.g., fanout) of the node. For example, the load of the node can comprise: a net capacitance of paths (e.g., wires or nets) between an output of the node and one or more of child nodes of the node; a capacitance (input pin capacitance) of input pins of one or more of child nodes of the node; or a sum of both.

Use of various embodiments can optimize (e.g., reduce) the maximum and average insertion delay in a routing tree of a circuit design, especially with respect to the critical paths of the routing tree. Various embodiments attempt to optimize (e.g., reduce) a load of a critical node, by moving or resizing (e.g., downsizing) one or more of its non-critical child nodes of the critical node, to optimize (e.g., reduce) insertion delay of the critical path of the routing tree. Some embodiments described herein provide a technical solution of moving or resizing (e.g., downsizing) one or more child nodes of a critical node of a routing tree (e.g., clock tree) in a circuit design to optimized insertion delay of a critical path of the routing tree. The technical solution provided by some embodiments can address a technical problem of sufficiently optimizing (e.g., reducing) insertion delay of a circuit design to satisfy one or more targets/constraints of the circuit design, where violating such targets/constraints can limit performance or prevent desired performance of a physical circuit manufactured based on the circuit design.

Reference will now be made in detail to embodiments of the present disclosure, examples of which are illustrated in the appended drawings. The present disclosure may, however, be embodied in many different forms and should not be construed as being limited to the embodiments set forth herein.

FIG. 1 is a diagram illustrating an example design process flow 100 for optimizing insertion delay in a circuit design based on one or more non-critical child nodes of a critical node of a routing tree, according to some embodiments. As shown, the design process flow 100 includes a design phase 110, a device fabrication phase 120, a design verification phase 130, and a device verification phase 140. The design phase 110 involves an initial design input 112 operation where the basic elements and functionality of a device are determined, as well as revisions based on various analyses and optimization of a circuit design. This design input 112 operation is where block instances are used in the circuit design and any additional circuitry for the design around the blocks is selected. The initial strategy, tactics, and context for the device to be created are also generated in the design input 112 operation, depending on the particular design algorithm to be used.

In some embodiments, following an initial selection of design values in the design input 112 operation, routing, timing analysis, and optimization are performed in a routing and optimization 114 operation, along with any other automated design processes. The routing and optimization 114 operation may also include other operations not shown, such as those relating to floorplanning, placement, post-placement optimization, and post-routing optimization. As shown, the routing and optimization 114 operation includes an insertion delay optimization 115 operation based on one or more non-critical child nodes of a critical node of a routing tree (hereafter, the insertion delay optimization 115 operation), which may be performed in accordance with various embodiments described herein. For some embodiments, at least some portion of the insertion delay optimization 115 operation can be performed prior to, during, or after a CTS process being performed on a circuit design.

While the design process flow 100 shows optimization occurring prior to a layout instance 116, timing analysis and optimization may be performed at any time to verify operation of a circuit design. For instance, in various embodiments, timing analysis in a circuit design may be performed prior to routing of connections in the circuit design; after routing, during register transfer level (RTL) operations; or as part of a signoff 118, as described below.

Design inputs are used in the design input 112 operation to generate an initial circuit layout. The design inputs may be further processed during the design input 112 operation via a process, such as logic-synthesis, to generate a circuit netlist mapped to a target standard library manufacturable by the foundry in a fabrication 122 operation. After design inputs are used in the design input 112 operation to generate an initial circuit layout, and any of the routing and optimization 114 operations are performed, a resulting layout is generated as the layout instance 116. The netlist, as placed by the layout instance 116, describes the physical layout dimensions of the device that match the design inputs. Prior to this layout being provided to a fabrication 122 operation, the signoff 118 is performed on the circuit design defined by the layout.

After signoff verification by the signoff 118, a verified version of the layout is used in the fabrication 122 operation to generate a physical circuit or device based on the circuit design, or additional testing and design updates may be performed using designer inputs or automated updates based on design simulation 132 operations or extraction, 3D modeling, and analysis 144 operations. Once the device is generated, the device can be tested as part of device test 142 operations and layout modifications generated based on actual device performance.

As described in more detail below, a design update 136 from the design simulation 132 operations; a design update 146 from the device test 142 operations or the extraction, 3D modeling, and analysis 144 operations; or the design input 112 operation may occur after the initial layout instance 116 is generated. In various embodiments, whenever design inputs are used to update or change an aspect of a circuit design, a timing analysis and the routing and optimization 114 operation may be performed.

Figure 2:
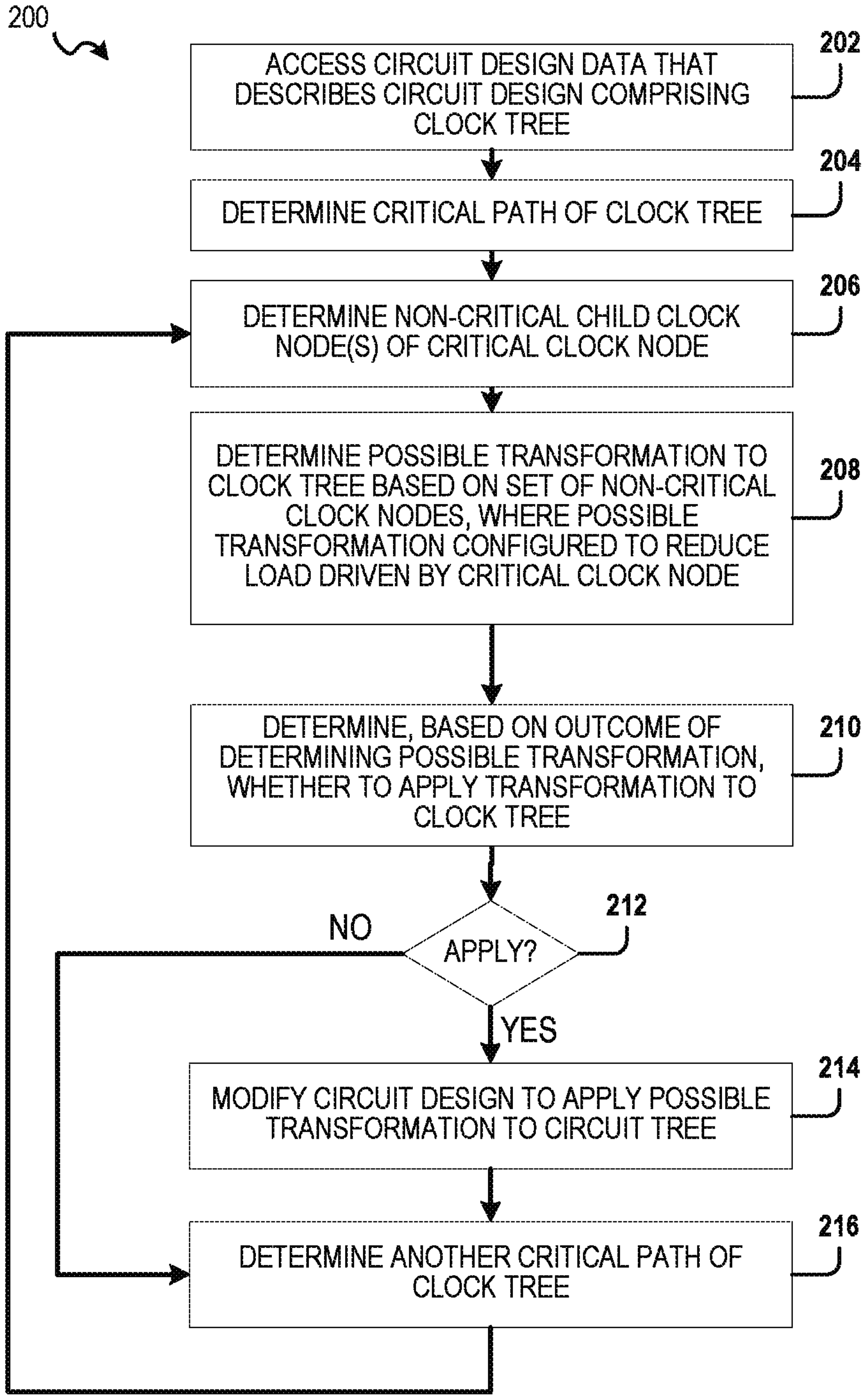
FIGS. 2 and 3 are flowcharts illustrating example methods for optimizing insertion delay in a circuit design based on one or more non-critical child nodes of a critical node of a routing tree, according to some embodiments.
Figure 3:
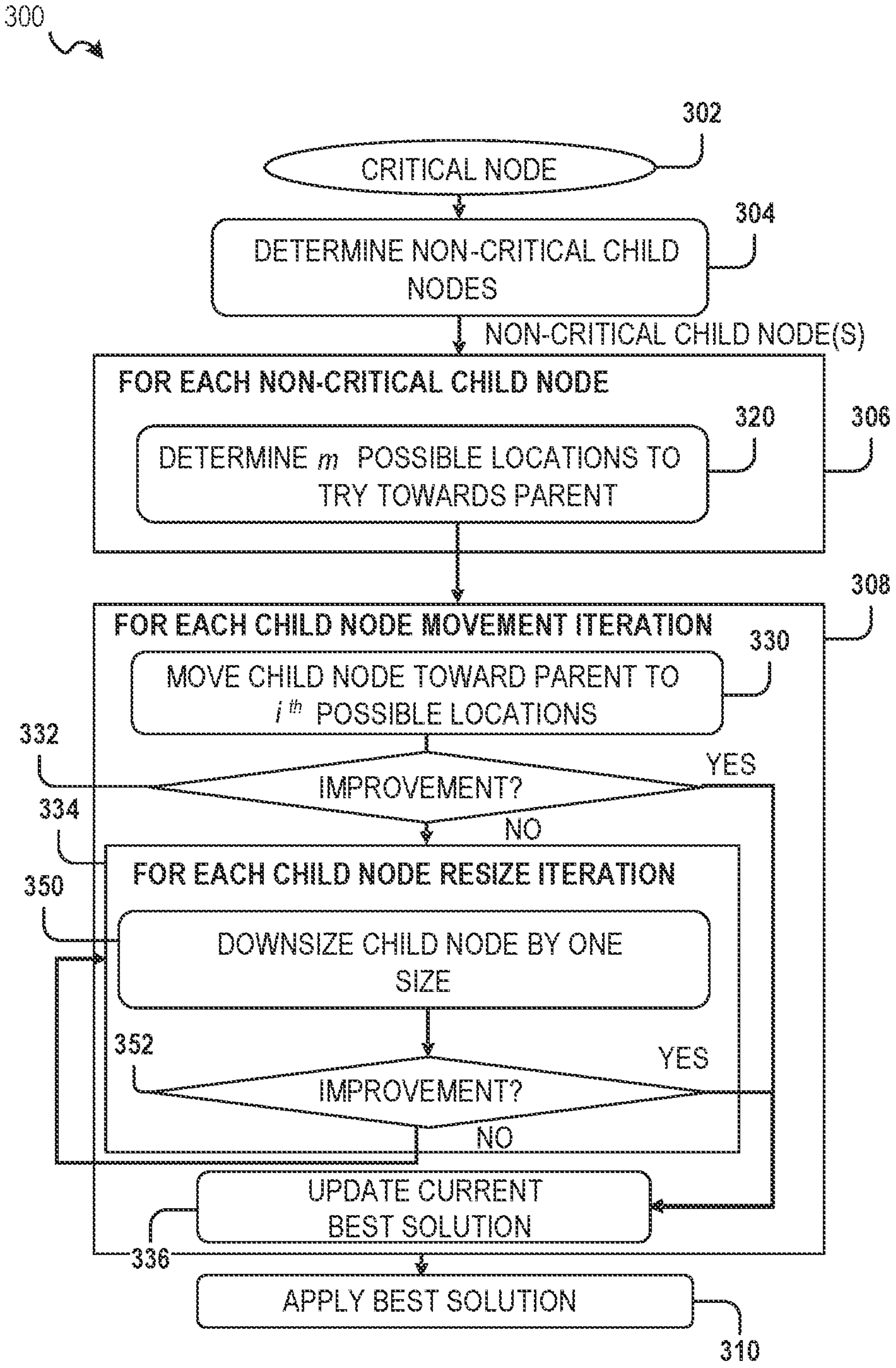

FIGS. 2 and 3 are flowcharts illustrating example methods for optimizing insertion delay in a circuit design based on one or more non-critical child nodes of a critical node of a routing tree, according to some embodiments. It will be understood that example methods described herein may be performed by a device, such as a computing device executing instructions of an EDA software system, in accordance with some embodiments. Additionally, example methods described herein may be implemented in the form of executable instructions stored on a computer-readable medium or in the form of electronic circuitry. For instance, the operations of any of methods 200, 300 of FIGS. 2 and 3 may be represented by executable instructions that, when executed by a processor of a computing device, cause the computing device to perform the method 200. Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel. For some embodiments, one or more operations of methods 200 and 300 are performed after a CTS process being performed on a circuit design (e.g., by an EDA software system). Though the methods 200, 300 are described herein with respect to a clock tree and clock nodes, for some embodiments, method 200 or method 300 can be applied to any routing tree of a circuit design that comprises critical and non-critical nodes.

As illustrated, at operation 202, circuit design data is accessed, where the design data describes a circuit design comprising a clock tree, and where the clock tree comprises one or more clock nodes of the circuit design. Additionally, the circuit design data can describe a netlist of the circuit design, where the netlist comprises the clock tree and one or more clocked circuit elements of the circuit design. A clocked circuit element can comprise one or more flip flops. Depending on the embodiment, the netlist can comprise non-clocked circuit elements of the circuit design. The netlist can include placement (e.g., placement information) for circuit elements (e.g., clocked and non-clocked circuit elements) of the circuit design.

During operation 204, a critical path of the clock tree is determined (e.g., identified). For instance, the critical path of the clock tree can be a path that runs between a parent clock node of the clock tree and a child clock node (e.g., critical child clock node), where the path has the longest (e.g., maximum) insertion delay (ID) in the clock tree. For some embodiments, the critical path of the clock tree is identified based on results from a timing analysis performed on the circuit design.

Thereafter, at operation 206, a set of non-critical child clock nodes (e.g., fanout nodes) of a critical clock node (e.g., critical gate, buffer, or inverter) is determined, where the critical clock node is on the critical path determined by operation 204. For various embodiments, the critical clock node is disposed on the critical path between a parent clock node of the critical clock node and a critical child clock node of the critical clock node. Additionally, for various embodiments, the clock tree includes one or more non-critical clock child nodes of the critical clock node, where the one or more non-critical clock child nodes are not on the critical path.

Operation 208 of method 200 determines a possible (or potential) transformation to the clock tree based on the set of non-critical child clock nodes (determined by operation 206), where the possible transformation is configured to reduce a load driven by the critical clock node, and where the possible transformation comprises at least one of: one or more non-critical child node movements that move one or more non-critical child nodes of the set of non-critical child nodes closer to the critical node; or one or more non-critical child node size adjustments that downsize one or more non-critical child nodes of the set of non-critical child nodes (e.g., downsize by one cell size). At least one child node movement in the set of child node movements can result in a reduction in an insertion delay of the critical path, and at least one child node size adjustment in the set of child node size adjustments can result in a reduction in an insertion delay of the critical path.

For various embodiments, the determining of the possible transformation comprises performing one or more non-critical child node movement iterations, during each of which one or more non-critical child node resize iterations can be performed. According to various embodiments, each non-critical child node movement iteration is configured to consider or evaluate movement of one or more non-critical child clock nodes to respective locations that are closer (e.g., in wirelength distance) to the critical node. Additionally, for some embodiments, each non-critical child node resize iteration is configured to consider or evaluate downsizing of one or more non-critical child clock nodes (e.g., without violating any overload design constraints of the circuit design).

For some embodiments, determining of the possible transformation comprises determining, for each individual non-critical child clock node of the set of non-critical child clock nodes, an ordered set of possible locations for the individual non-critical child clock node. The ordered set of possible locations can comprise a predetermined number of possible locations, and the ordered set of possible locations can be ordered such that each subsequent possible location successively reduces a wirelength distance between the individual non-critical child clock node and the critical clock node. As a result, multiple ordered sets of possible locations are determined, with each individual non-critical child clock node (of the set of non-critical child clock nodes) having a respective ordered set of possible locations to be used by one or more non-critical child node movement iterations performed. An example of determining an ordered set of possible locations is described and illustrated with respect to FIG. 5.

For various embodiments, determining the ordered set of possible locations for an individual non-critical child clock node comprises determining a bounding box that contains the critical clock node and the individual non-critical child clock node, and determining, based on the bound box, the ordered set of possible locations for the individual non-critical child clock node. An example of this is described and illustrated with respect to FIG. 6.

According to some embodiments, determining the possible transformation comprises using the multiple ordered set of possible locations to perform one or more non-critical child node movement iterations. In particular, when performing the non-critical child node movement iteration for an i-th time, the non-critical child node movement iteration can comprise applying a set of non-critical child node movements to the clock tree that cause each select non-critical child clock node (in the set of non-critical child clock nodes) to move, from a current location of the select non-critical child clock node, to an i-th possible location in the ordered set of possible locations of the select non-critical child clock node. Additionally, when performing the non-critical child node movement iteration for the i-th time, the non-critical child node movement iteration can comprise determining whether the set of non-critical child node movements results in a reduction of an insertion delay of the critical path. Further, the non-critical child node movement iteration can determine (e.g., check) whether the set of non-critical child node movements does not violate any design constraints (e.g., design rule constraints (DRCs)). In response to determining that the set of non-critical child node movements results in the reduction of the insertion delay of the critical path (and does not violate any design constraints), the non-critical child node movement iteration can update the possible transformation with the set of non-critical child node movements (e.g., as the best solution), and the non-critical child node movement iteration can be performed for an i+I-th time. Alternatively, in response to determining that the set of non-critical child node movements does not result in the first reduction of the insertion delay of the critical path (or does violate in at least one design constraint), the non-critical child node movement iteration can perform a non-critical child node resize iteration one or more times. An example of moving non-critical child clock nodes over multiple non-critical child node movement iterations is described and illustrated with respect to FIG. 7.

For various embodiments, a non-critical child node resize iteration comprises applying a set of non-critical child node size adjustments to the clock tree that cause at least one non-critical child clock node in the set of non-critical child clock nodes to be downsized. The non-critical child node resize iteration can comprise determining whether the set of non-critical child node size adjustments results in a second reduction of the insertion delay of the critical path. Further, the non-critical child node resize iteration can determine (e.g., check) whether the set of non-critical child node size adjustments does not violate any design constraints (e.g., design rule constraints (DRCs)). In response to determining that the set of non-critical child node size adjustments results in the second reduction of the insertion delay of the critical path (and does not violate any design constraints), the non-critical child node resize iteration can update the possible transformation with the set of non-critical child node size adjustments. Additionally, in response to determining that the set of non-critical child node size adjustments does not result in the second reduction of the insertion delay of the critical path (or does violate in at least one design constraint), the non-critical child node resize iteration can perform the non-critical child node resize iteration for a subsequent time to further downsize at least one non-critical child clock node in the set of non-critical child clock nodes. An example of downsizing non-critical child clock nodes over multiple non-critical child node resize iterations is described and illustrated with respect to FIG. 8.

Thereafter, operation 210 of method 200 determines, based on an outcome of the determining of the possible transformation, whether to apply the possible transformation (evaluated by operation 208) to the clock tree. Depending on the embodiment, the outcome of the possible transformation can comprise an impact (e.g., increase or reduction) on an insertion delay of the critical path, an impact (e.g., increase or reduction) on the load driven by the critical node, or both. For instance, if the outcome of determining the possible transformation indicates in an improvement (e.g., reduction) to the insertion delay, an improvement (e.g., reduction) on the load driven by the critical node, or both, operation 210 can determine that the possible transformation should be applied to the clock tree. If however the outcome of determining the possible transformation indicates otherwise (e.g., no reduction in the insertion delay, no reduction load, or both), operation 210 can determine that the possible transformation should not be applied to the clock tree. At decision point 212, if operation 210 determines that the possible transformation should be applied to the clock tree, method 200 proceeds to operation 214, and if operation 210 determines that the possible transformation should not be applied to the clock tree, method 200 proceeds to operation 216.

At operation 214, the circuit design is modified to apply the possible transformation to the circuit tree. In doing so, operation 214 can commit the possible transformation to the clock tree of the circuit design, thereby rendering the possible transformation of the clock tree as an actual transformation of the clock tree. The expected result of operation 214 is that a reduction of a load of the critical node by the set of non-critical clock child nodes (determined by operation 206), which in turn can result in a reduction in the insertion delay of the critical path (possibly even rendering it a non-critical path). After operation 214, method 200 proceeds to operation 216.

At operation 216, determines (e.g., identifies) another (e.g., a next) critical path of the clock tree (e.g., as transformed by operation 214) and returns to operation 206 to repeat method 200 with respect to the other critical path. For various embodiments, the other critical path determined is different from any prior paths considered by method 200.

Referring now to FIG. 3, method 300 illustrates various loops for optimizing insertion delay in a circuit design based on one or more non-critical child nodes of a critical node of a routing tree, where method 300 can attempt to reduce a load of the critical node (to reduce the insertion delay of the critical node) by moving one or more non-critical child nodes toward the critical node, by resizing one or more non-critical child nodes, or both. Specifically, at operation 304, one or more non-critical child nodes of a critical node 302 (of a routing tree) is determined. During operation 306, for each individual non-critical child node (of the one or more non-critical child nodes), operation 320 determines a set of possible locations (of m-number of possible locations) to try for moving the individual non-critical child node toward its parent critical node. For some embodiments, the m number of possible locations (in the set of possible locations) for the individual non-critical child node includes a current location of the individual non-critical child node.

During operation 308, a non-critical child node movement iteration is performed m times to cover the m-number of possible locations for each individual non-critical child node. When the non-critical child node movement iteration is performed an i-th time, operation 330 moves each individual non-critical child node, to the i-the possible location of the individual non-critical child node, toward the parent critical node. For some embodiments, the non-critical child nodes moved are only the ones that are allowed to be moved without violating any design constraints (e.g., DRCs) of the circuit design. Subsequently, operation 332 determines (e.g., checks or evaluates) whether the movement performed by operation 330 results in an improvement (e.g., reduction) in the insertion delay of the critical path. If the movement performed by operation 330 results in an improvement, method 300 proceeds to operation 336, where a current best solution for optimizing the insertion delay of the critical path (as determined by method 300) is updated with the movement performed by operation 330, and the non-critical child node movement iteration is performed another time (for the i+I-th time). For some embodiments, the performance of the non-critical child node movement iteration exits early after the best solution is determined to improve the maximum insertion delay. However, if the movement performed by operation 330 does not result in an improvement, method 300 proceeds to operation 334.

During operation 334, a non-critical child node resize iteration is performed one or more times (e.g., a user-determined number of times). During each performance of the non-critical child node resize iteration, operation 350 causes one or more non-critical child nodes (e.g., each non-critical child node) of the parent critical node to be downsized by one cell size. In doing so, operation 350 can reduce the load of the input capacitance of the non-critical child nodes on the parent critical node. For some embodiments, the non-critical child nodes downsized are only the ones that are allowed to be downsized without violating any design constraints (e.g., DRCs) of the circuit design, such as an overload design constraint, slew, maximum capacitance, and the like. Subsequently, operation 352 determines (e.g., checks or evaluates) whether the resizing performed by operation 350 results in an improvement (e.g., reduction) in the insertion delay of the critical path. If the resizing performed by operation 350 results in an improvement, method 300 proceeds to operation 336, where a current best solution for optimizing the insertion delay of the critical path (as determined by method 300) is updated with the resizing performed by operation 350, and the non-critical child node resize iteration is performed another time (to further downsize one or more non-critical child nodes). For some embodiments, the performance of the non-critical child node resize iteration exits early after the best solution is determined to improve the maximum insertion delay. However, if the resizing performed by operation 350 does not result in an improvement, method 300 proceeds to perform the non-critical child node resize iteration again to further downsize one or more non-critical child nodes.

Eventually, the non-critical child node resize iteration is no longer being performed repeatedly, operation 310 applies the best solution, as last updated by operation 336, to the routing tree.

Figure 4:
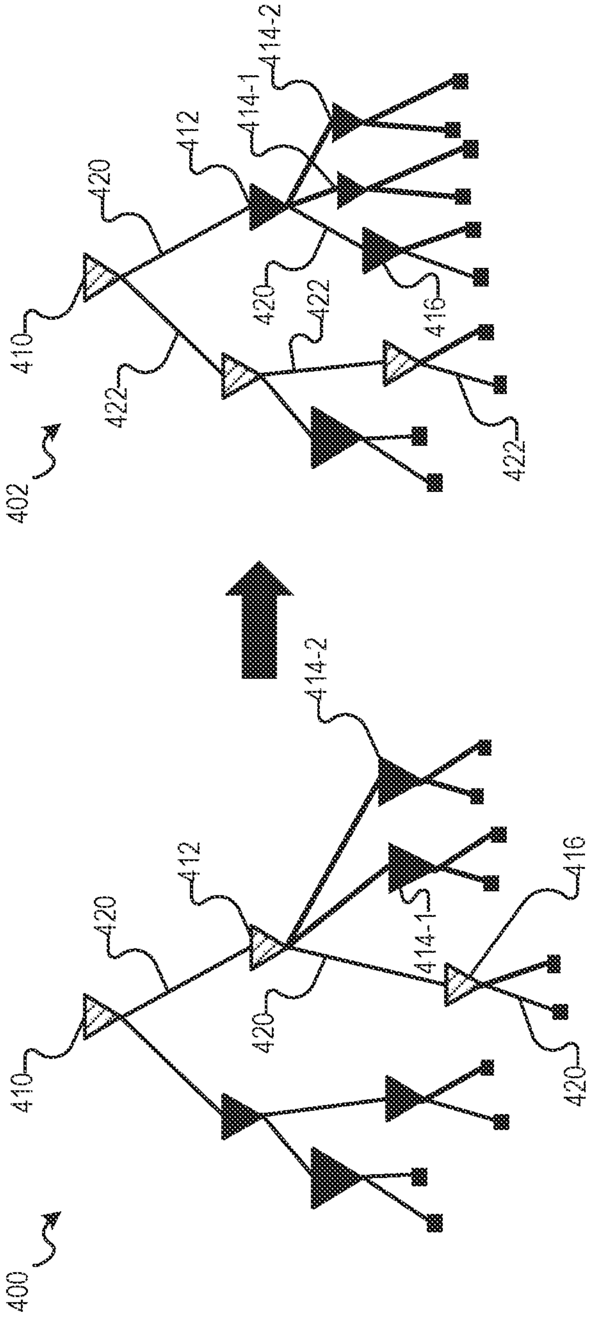
FIG. 4 is a diagram illustrating a routing tree before and after a method optimizing insertion delay in a circuit design based on one or more non-critical child nodes of a critical node of the routing tree, according to some embodiments.

FIG. 4 is a diagram illustrating a routing tree 400 before and after a method optimizing insertion delay in a circuit design based on one or more non-critical child nodes of a critical node of the routing tree, according to some embodiments. In particular, the routing tree 400 comprises a critical node 412, a parent node 410 of the critical node 412, non-critical child nodes 414-1, 414-2 of the critical node 412, a critical child node 416 of the critical node 412, and a critical path 420. As shown, the critical path 420 between the parent node 410 and the critical child node 416 passes through the critical node 412. A routing tree 402 represents the routing tree 400 after application of a method of some embodiments. As shown, each of the non-critical child nodes 414-1, 414-2 are moved closer to the critical node 412, and each of the non-critical child nodes 414-1, 414-2 is downsized (e.g., by one or more cell sizes), both which reduce the (fanout) load of the critical node 412, which in turn can reduce an insertion delay of the critical path 420. Depending on the embodiment, the insertion delay of a critical path can be reduced to such an extent that the critical path is no longer the critical path of the routing tree 402. For example, as shown, the insertion delay of the critical path 420 is reduced to such an extent that path 422 of the routing tree 402 is rendered the new critical path in the routing tree 402.

Figure 5:
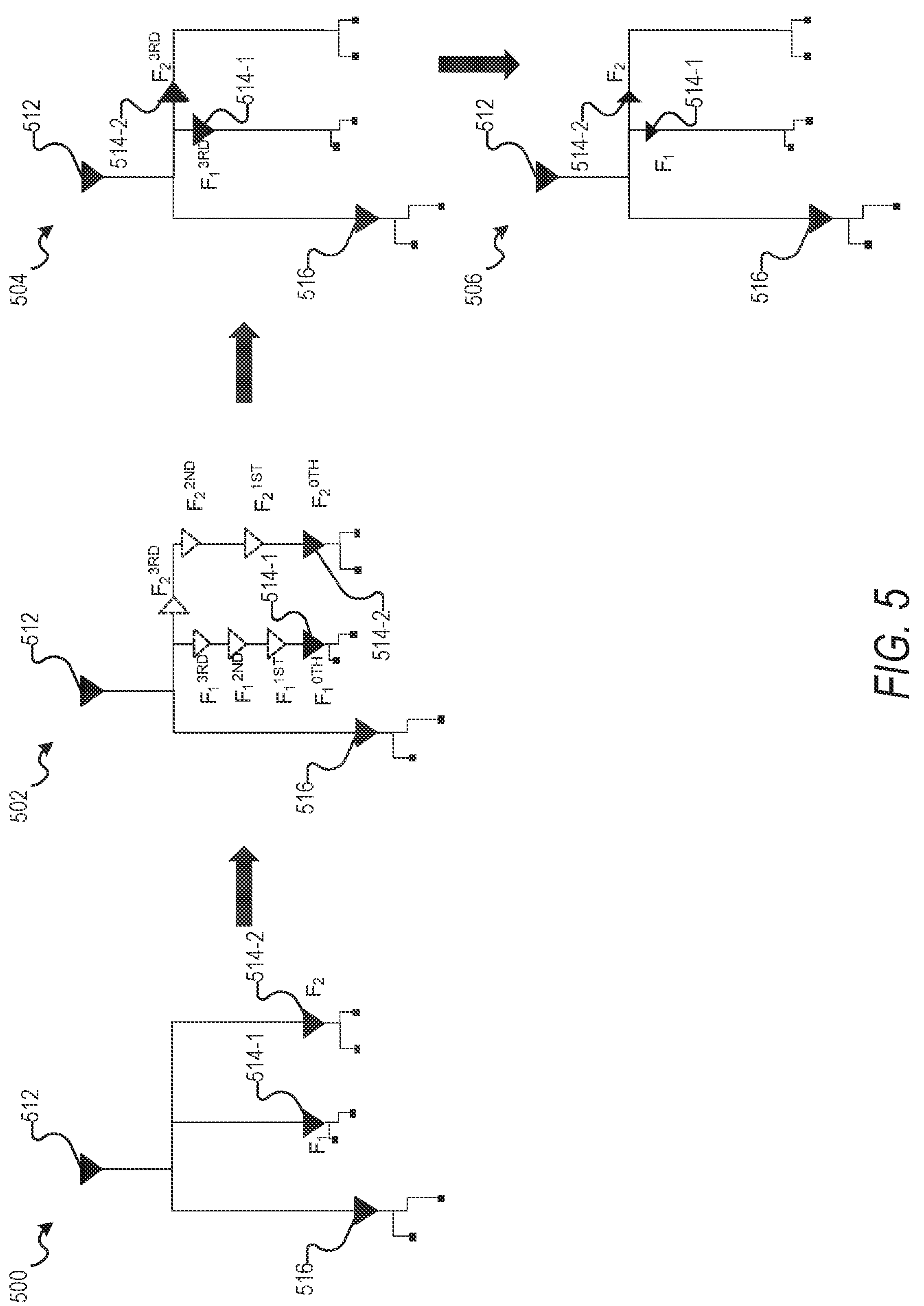
FIG. 5 is a diagram illustrating different stages of a method for optimizing insertion delay by moving and downsizing non-critical child nodes of a critical node of a routing tree of a circuit design, according to some embodiments.

FIG. 5 is a diagram illustrating different stages of a method for optimizing insertion delay by moving and downsizing non-critical child nodes 514-1, 514-2 of a critical node 512 of a routing tree 500 (e.g., clock tree) of a circuit design, according to some embodiments. In FIG. 5, the routing tree 500 comprises the critical node 512, the non-critical child nodes 514-1, 514-2 of the critical node 512, and a critical child node 516 of the critical node 512. Routing tree 502 illustrates a set of possible locations $F_1^{0th}$, $F_1^{1st}$, $F_1^{2nd}$, $F_1^{3rd}$ determined for the non-critical child node 514-1, and a set of possible locations $F_2^{0th}$, $F_2^{1st}$, $F_2^{2nd}$, $F_2^{3rd}$ determined for the non-critical child node 514-2. As shown, and in accordance with various embodiments, each set of possible locations includes the current (e.g., initial or original) location (as the 0th possible location) of its respective non-critical child node. For some embodiments, the initial location is included in the set of possible locations to enable a possible transformation where only a resize of non-critical child nodes is performed. Routing tree 504 illustrates where, after performing non-critical child node movement iterations at least 4 times, each of the non-critical child nodes 514-1, 514-2 is ultimately moved to its respective $3^{rd}$ possible location. Routing tree 506 illustrates where, based on performance of one or more non-critical child resize iterations, each of the non-critical child nodes 514-1, 514-2 is ultimately downsized.

Figure 6:
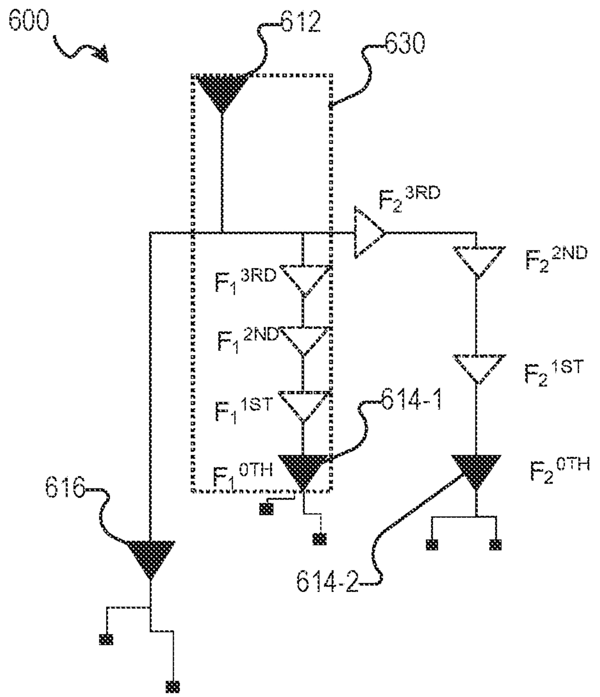
FIG. 6 is a diagram illustrating determining a set of possible locations for each of non-critical child nodes of a critical node of a routing tree of a circuit design, according to some embodiments.

FIG. 6 is a diagram illustrating determining a set of possible locations for each of non-critical child nodes 614-1, 614-2 of a critical node 612 of a routing tree 600 (e.g., clock tree) of a circuit design, according to some embodiments. In FIG. 6, the routing tree 600 comprises the critical node 612, the non-critical child nodes 614-1, 614-2 of the critical node 612, and a critical child node 616 of the critical node 612. Additionally, the routing tree 600 illustrates a set of possible locations $F_1^{0th}$, $F_1^{1st}$, $F_1^{2nd}$, $F_1^{3rd}$ determined for the non-critical child node 614-1, and a set of possible locations $F_2^{0th}$, $F_2^{1st}$, $F_2^{2nd}$, $F_2^{3rd}$ determined for the non-critical child node 614-2. According to various embodiments, a bounding box is used to determine each set of possible locations for an individual non-critical child node. As described herein, the set of possible locations for an individual non-critical child node can include a current location of the individual non-critical child node (e.g., as the 0th possible location). Additionally, the set of possible locations for an individual non-critical child node can include m−1 possible locations (e.g., 1 through m−1) each of which successively reduces a load of the individual non-critical child node on the critical node 612. For some embodiments, a possible location (of the set of possible locations) for an individual non-critical child node comprises any location within a bounding box. For various embodiments, the bounding box is determined such that the bound box contains both the critical node 612 and the individual non-critical child node for which the set of possible locations is being determined. For example, as shown in FIG. 6, for determine a set of possible locations for the non-critical child node 614-1, a bounding box 630 is determined to contain (e.g., is formed around) the critical node 612 and the non-critical child node 614-1, and based on the bounding box, a set of possible locations $F_1^{0th}$, $F_1^{1st}$, $F_1^{2nd}$, $F_1^{3rd}$ is determined for the non-critical child node 614-1.

Figure 7:
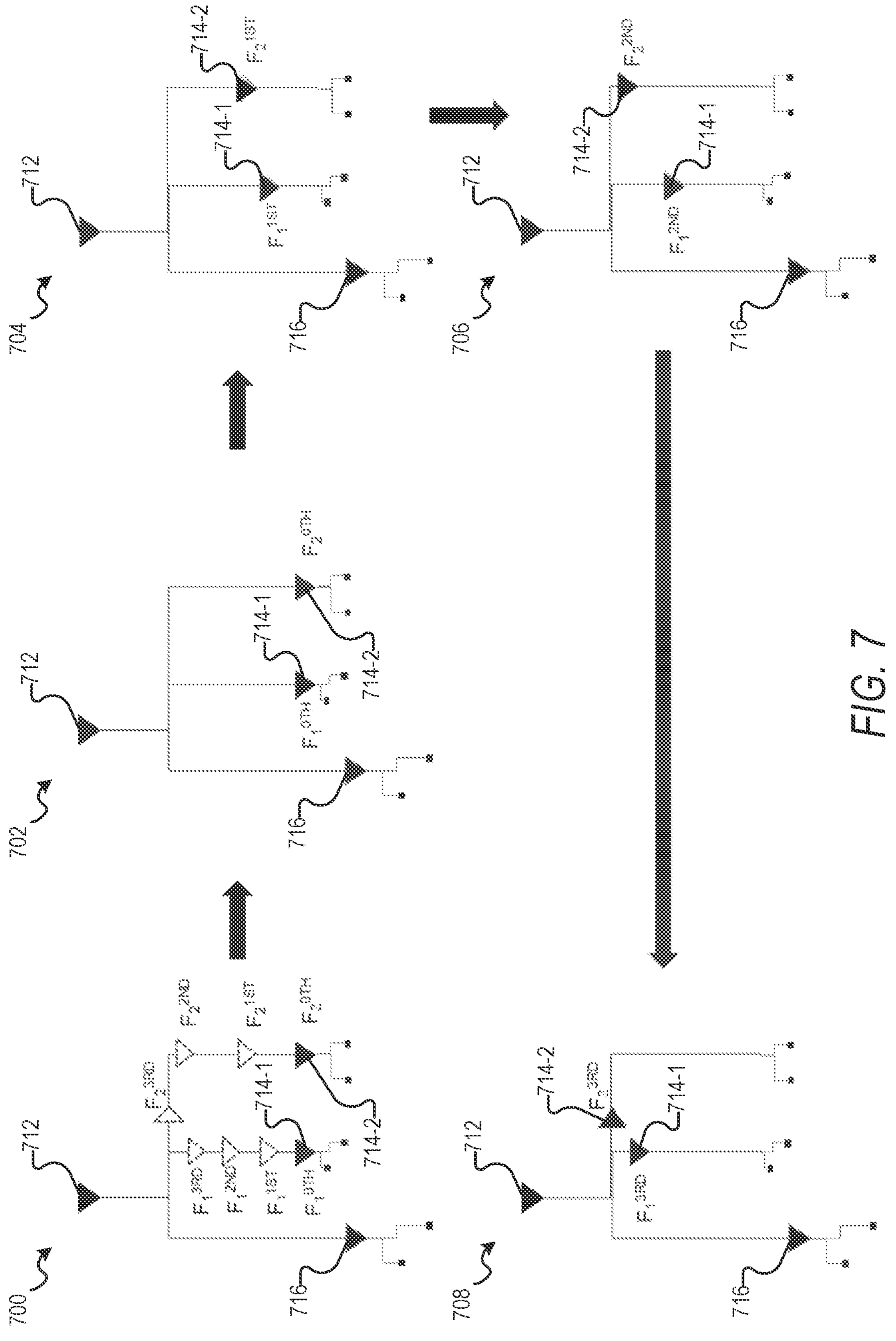
FIG. 7 is a diagram illustrating movement of non-critical child nodes of a critical node of a routing tree of a circuit design over different possible locations, according to some embodiments.

FIG. 7 is a diagram illustrating movement of non-critical child nodes 714-1, 714-2 of a critical node 712 of a routing tree 700 (e.g., clock tree) of a circuit design over different possible locations, according to some embodiments. In FIG. 7, the routing tree 700 comprises the critical node 712, the non-critical child nodes 714-1, 714-2 of the critical node 712, and a critical child node 716 of the critical node 712. Additionally, the routing tree 700 illustrates a set of possible locations $F_1^{0th}$, $F_1^{1st}$, $F_1^{2nd}$, $F_1^{3rd}$ determined for the non-critical child node 714-1, and a set of possible locations $F_2^{0th}$, $F_2^{1st}$, $F_2^{2nd}$, $F_2^{3rd}$ determined for the non-critical child node 714-2. According to some embodiments, non-critical child nodes are moved from their respective current (e.g., initial or original) locations to different possible locations by performing one or more non-critical child node movement iterations. Additionally, for some embodiments, a given non-critical child node is only moved if the move does not violate any design constraints (e.g., DRCs) of the circuit design.

As shown by routing tree 702, the non-critical child node 714-1 starts at its current (e.g., initial or original) location at $F_1^{0th}$, and the non-critical child node 714-2 starts at its current (e.g., initial or original) location at $F_2^{0th}$, for the 0th non-critical child node movement iteration. During the 0th non-critical child node movement iteration, and while the non-critical child node 714-1 is at $F_1^{0th}$ and the non-critical child node 714-2 is at $F_2^{0th}$, one or more size adjustments (e.g., downsizings) of each of the non-critical child nodes 714-1, 714-2 can be considered or evaluated over one or more non-critical child node resize iterations.

Subsequently, as shown by the routing tree 704, the 1st non-critical child node movement iteration moves the non-critical child node 714-1 to possible location $F_1^{1st}$, and moves the non-critical child node 714-2 to possible location $F_2^{1st}$. During the 1st non-critical child node movement iteration, and while the non-critical child node 714-1 is at $F_1^{1st}$ and the non-critical child node 714-2 is at $F_2^{1st}$, one or more size adjustments (e.g., downsizings) of each of the non-critical child nodes 714-1, 714-2 can be considered or evaluated over one or more non-critical child node resize iterations.

Subsequently, as shown by the routing tree 706, the 2nd non-critical child node movement iteration moves the non-critical child node 714-1 to possible location $F_1^{2nd}$, and moves the non-critical child node 714-2 to possible location $F_2^{2nd}$. During the 2nd non-critical child node movement iteration, and while the non-critical child node 714-1 is at $F_1^{2nd}$ and the non-critical child node 714-2 is at $F_2^{2nd}$, one or more size adjustments (e.g., downsizings) of each of the non-critical child nodes 714-1, 714-2 can be considered or evaluated over one or more non-critical child node resize iterations.

Finally, as shown by the routing tree 708, the 3rd non-critical child node movement iteration moves the non-critical child node 714-1 to possible location $F_1^{3rd}$, and moves the non-critical child node 714-2 to possible location $F_2^{3rd}$. During the 3rd non-critical child node movement iteration, and while the non-critical child node 714-1 is at $F_1^{3rd}$ and the non-critical child node 714-2 is at $F_2^{3rd}$, one or more size adjustments (e.g., downsizings) of each of the non-critical child nodes 714-1, 714-2 can be considered or evaluated over one or more non-critical child node resize iterations.

Figure 8:
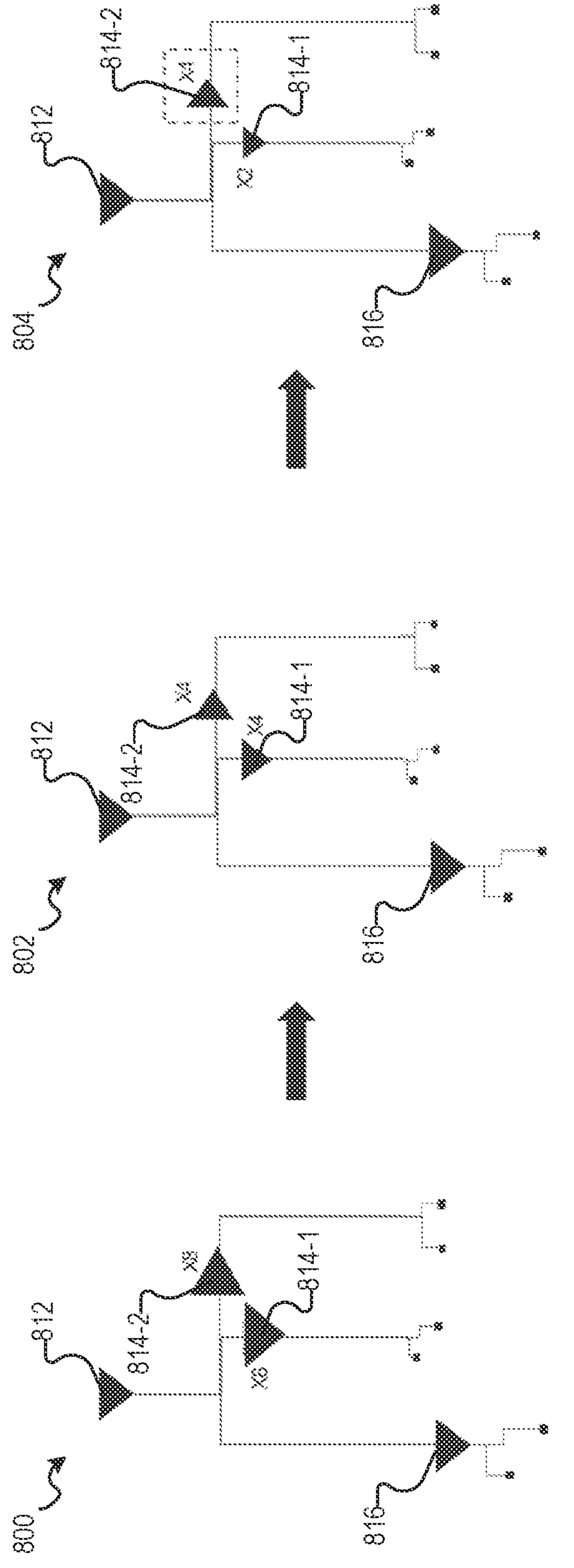
FIG. 8 is a diagram illustrating downsizing of non-critical child nodes of a critical node of a routing tree of a circuit design over non-critical child node resize iterations, according to some embodiments.

FIG. 8 is a diagram illustrating downsizing of non-critical child nodes 814-1, 814-2 of a critical node 812 of a routing tree 800 (e.g., clock tree) of a circuit design over non-critical child node resize iterations, according to some embodiments. In FIG. 8, the routing tree 800 comprises the critical node 812, the non-critical child nodes 814-1, 814-2 of the critical node 812, and a critical child node 816 of the critical node 812. In particular, the non-critical child node 814-1 is at possible location $F_1^{3rd}$ and the non-critical child node 814-2 is at possible $F_2^{3rd}$. In the routing tree 800, each of the non-critical child nodes 814-1, 814-2 is shown at an original size of ×8, which can represent a reference size of 8 units. Subsequently, as shown by routing tree 802, a first non-critical child node resize iteration downsizes each of the non-critical child nodes 814-1, 814-2 to a size of ×4, which can represent a reference size of 4 units and which can represent half of the original size. Next, as shown by routing tree 804, a second non-critical child node resize iteration downsizes the non-critical child node 814-1 to a size of ×2, which can represent a reference size of 2 units and which can represent half of current size of the non-critical child node 814-1 (as resized by the last non-critical child node resize iteration). For various embodiments, the non-critical child nodes (by a non-critical child node resize iteration) downsized are only the ones that are allowed to be downsized without violating any design constraints (e.g., DRCs) of the circuit design, such as an overload design constraint, slew, maximum capacitance, and the like. For example, as illustrated by routing tree 804, the non-critical child node 814-2 is not downsized further as it would violate an overload design constraint (e.g., DRC).

Figure 9:
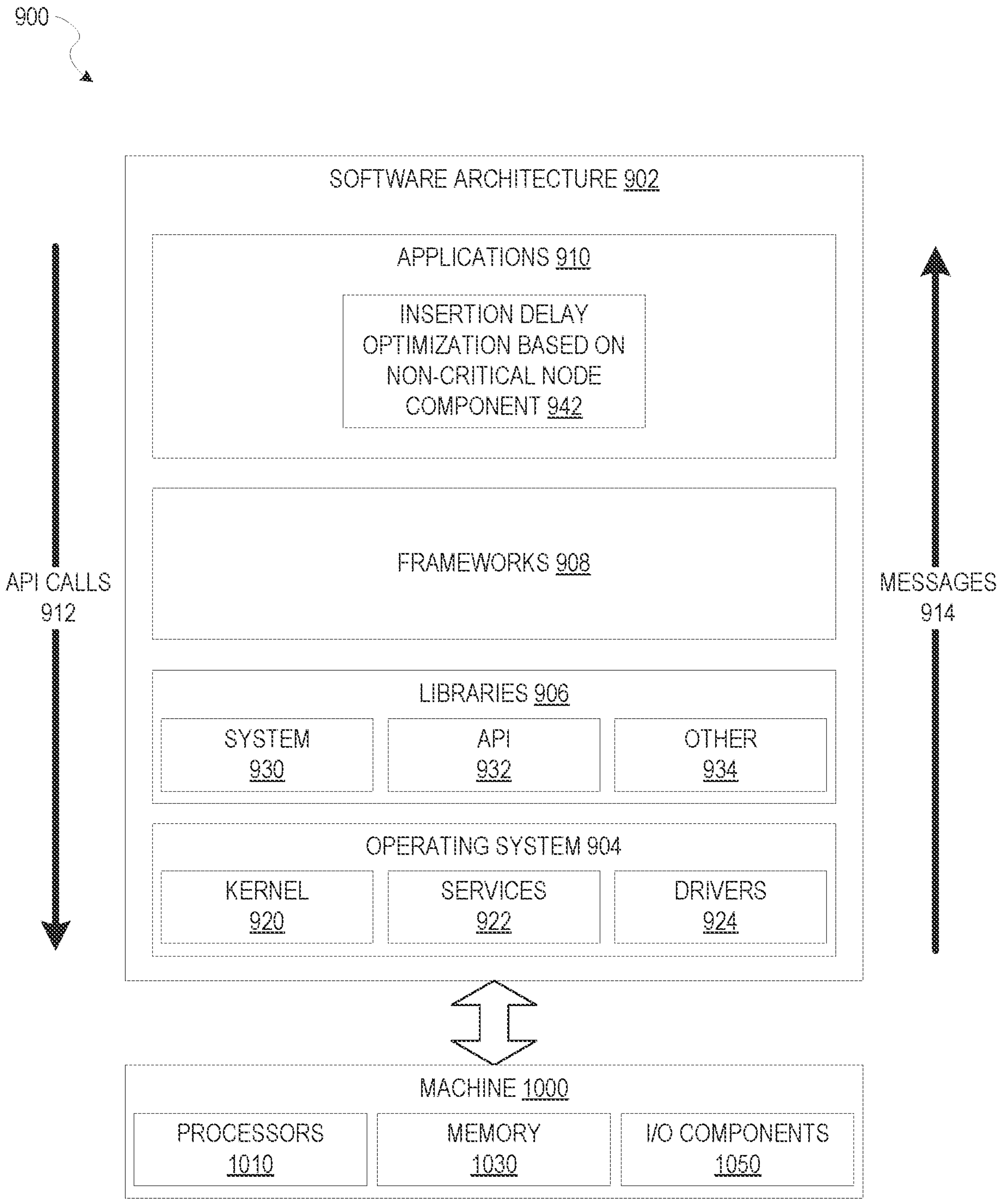
FIG. 9 is a block diagram illustrating an example of a software architecture that may be operating on an EDA computing device and may be used with methods for optimizing insertion delay in a circuit design based on one or more non-critical child nodes of a critical node of a routing tree, according to some embodiments.

FIG. 9 is a block diagram 900 illustrating an example of a software architecture 902 that may be operating on an EDA computer and may be used with methods for optimizing insertion delay in a circuit design based on one or more non-critical child nodes of a critical node of a routing tree, according to some embodiments. The software architecture 902 can be used as an EDA computing device to implement any of the methods described above. Aspects of the software architecture 902 may, in various embodiments, be used to store circuit designs, and to facilitate generation of a circuit design in an EDA environment by optimizing insertion delay in a circuit design based on one or more non-critical child nodes, from which physical devices may be generated.

FIG. 9 is merely a non-limiting example of a software architecture 902, and it will be appreciated that many other architectures can be implemented to facilitate the functionality described herein. In various embodiments, the software architecture 902 is implemented by hardware such as a machine 1000 of FIG. 10 that includes processors 1010 (e.g., hardware processors), memory 1030, and input/output (I/O) components 1050. In this example, the software architecture 902 can be conceptualized as a stack of layers where each layer may provide a particular functionality. For example, the software architecture 902 includes layers such as an operating system 904, libraries 906, software frameworks 908, and applications 910. Operationally, the applications 910 invoke application programming interface (API) calls 912 through the software stack and receive messages 914 in response to the API calls 912, consistent with some embodiments. In various embodiments, any client device, any server computer of a server system, or any other device described herein may operate using elements of the software architecture 902. An EDA computing device described herein may additionally be implemented using aspects of the software architecture 902, with the software architecture 902 adapted for optimizing insertion delay in a circuit design based on one or more non-critical child nodes in any manner described herein.

In some embodiments, an EDA application of the applications 910 optimizes insertion delay in a circuit design based on one or more non-critical child nodes according to embodiments described herein using various components or modules within the software architecture 902. For example, in some embodiments, an EDA computing device similar to the machine 1000 includes the memory 1030 and the one or more processors 1010. The processors 1010 also implement insertion delay optimization based on non-critical node component 942 (hereafter, the insertion delay optimization component 942) for optimizing insertion delay in a circuit design based on one or more non-critical child nodes, in accordance with various embodiments described herein.

In various other embodiments, rather than being implemented as components or modules of the one or more applications 910, the insertion delay optimization component 942 may be implemented using elements of the libraries 906, the operating system 904, or the software frameworks 908.

In various implementations, the operating system 904 manages hardware resources and provides common services. The operating system 904 includes, for example, a kernel 920, services 922, and drivers 924. The kernel 920 acts as an abstraction layer between the hardware and the other software layers, consistent with some embodiments. For example, the kernel 920 provides memory management, processor management (e.g., scheduling), component management, networking, and security settings, among other functionalities. The services 922 can provide other common services for the other software layers. The drivers 924 are responsible for controlling or interfacing with the underlying hardware, according to some embodiments. For instance, the drivers 924 can include display drivers, signal-processing drivers to optimize modeling computation, memory drivers, serial communication drivers (e.g., Universal Serial Bus (USB) drivers), WI-FI® drivers, audio drivers, power management drivers, and so forth.

In some embodiments, the libraries 906 provide a low-level common infrastructure utilized by the applications 910. The libraries 906 can include system libraries 930 such as libraries of blocks for use in an EDA environment or other libraries that can provide functions such as memory allocation functions, string manipulation functions, mathematical functions, and the like. In addition, the libraries 906 can include API libraries 932 such as media libraries (e.g., libraries to support presentation and manipulation of various media formats such as Joint Photographic Experts Group (JPEG or JPG), or Portable Network Graphics (PNG)), graphics libraries (e.g., an OpenGL framework used to render in 2D and 3D in a graphic context on a display), database libraries (e.g., SQLite to provide various relational database functions), web libraries (e.g., WebKit to provide web browsing functionality), and the like. The libraries 906 may also include other libraries 934.

The software frameworks 908 provide a high-level common infrastructure that can be utilized by the applications 910, according to some embodiments. For example, the software frameworks 908 provide various graphic user interface (GUI) functions, high-level resource management, high-level location services, and so forth. The software frameworks 908 can provide a broad spectrum of other APIs that can be utilized by the applications 910, some of which may be specific to a particular operating system 904 or platform. In various embodiments, the systems, methods, devices, and instructions described herein may use various files, macros, libraries, and other elements of an EDA design environment to implement optimizing insertion delay in a circuit design based on one or more non-critical child nodes as described herein. This includes analysis of input design files for an integrated circuit design, along with any element of hierarchical analysis that may be used as part of or along with the embodiments described herein. While netlist files, library files, SDC files, and view definition files are examples that may operate within the software architecture 902, it will be apparent that other files and structures may provide a similar function, in various embodiments.

Certain embodiments are described herein as including logic or a number of components, modules, elements, or mechanisms. Such components or modules can constitute either software components or modules (e.g., code embodied on a machine-readable medium or in a transmission signal) or hardware components or modules. A "hardware component" or "hardware module" is a tangible unit capable of performing certain operations and can be configured or arranged in a certain physical manner. In various embodiments, one or more computer systems (e.g., a standalone computer system, a client computer system, or a server computer system) or one or more hardware components or modules of a computer system (e.g., a processor or a group of processors) are configured by software (e.g., an application or application portion) as a hardware component or module that operates to perform certain operations as described herein.

In some embodiments, a hardware component or module is implemented mechanically, electronically, or any suitable combination thereof. For example, a hardware component or module can include dedicated circuitry or logic that is permanently configured to perform certain operations. For example, a hardware component or module can be a special-purpose processor, such as a field-programmable gate array (FPGA) or an application-specific integrated circuit (ASIC). A hardware component or module may also include programmable logic or circuitry that is temporarily configured by software to perform certain operations. For example, a hardware component or module can include software encompassed within a general-purpose processor or other programmable processor. It will be appreciated that the decision to implement a hardware component or module mechanically, in dedicated and permanently configured circuitry, or in temporarily configured circuitry (e.g., configured by software) can be driven by cost and time considerations.

Accordingly, the phrase "component" or "module" should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware components or modules are temporarily configured (e.g., programmed), each of the hardware modules need not be configured or instantiated at any one instance in time. For example, where a hardware component or module comprises a general-purpose hardware processor configured by software to become a special-purpose processor, the general-purpose processor may be configured as respectively different special-purpose processors (e.g., comprising different hardware components or modules) at different times. Software can accordingly configure a particular processor or processors, for example, to constitute a particular hardware component or module at one instance of time and to constitute a different hardware module at a different instance of time.

Hardware components or modules can provide information to, and receive information from, other hardware components or modules. Accordingly, the described hardware components or modules can be regarded as being communicatively coupled. Where multiple hardware components or modules exist contemporaneously, communications can be achieved through signal transmission (e.g., over appropriate circuits and buses) between or among two or more of the hardware components or modules. In embodiments in which multiple hardware components or modules are configured or instantiated at different times, communications between or among such hardware components or modules may be achieved, for example, through the storage and retrieval of information in memory structures to which the multiple hardware components or modules have access. For example, one hardware component or module performs an operation and stores the output of that operation in a memory device to which it is communicatively coupled. A further hardware component or module can then, at a later time, access the memory device to retrieve and process the stored output. Hardware components or modules can also initiate communications with input or output devices, and can operate on a resource (e.g., a collection of information).

The various operations of example methods described herein can be performed, at least partially, by one or more processors that are temporarily configured (e.g., by software) or permanently configured to perform the relevant operations. Whether temporarily or permanently configured, such processors constitute processor-implemented components or modules that operate to perform one or more operations or functions described herein. As used herein, "processor-implemented component" or "processor-implemented module" refers to a hardware component or module implemented using one or more processors.

Similarly, the methods described herein can be at least partially processor-implemented, with a particular processor or processors being an example of hardware. For example, at least some of the operations of a method can be performed by one or more processors or processor-implemented components or modules. Moreover, the one or more processors may also operate to support performance of the relevant operations in a "cloud computing" environment or as a "software as a service" (SaaS). For example, at least some of the operations may be performed by a group of computers (as examples of machines 1000 including processors 1010), with these operations being accessible via a network (e.g., the Internet) and via one or more appropriate interfaces (e.g., an API). In certain embodiments, for example, a client device may relay or operate in communication with cloud computing systems and may access circuit design information in a cloud environment.

The performance of certain of the operations may be distributed among the processors, not only residing within a single machine 1000, but deployed across a number of machines 1000. In some embodiments, the processors 1010 or processor-implemented components or modules are located in a single geographic location (e.g., within a home environment, an office environment, or a server farm). In some other embodiments, the processors or processor-implemented components or modules are distributed across a number of geographic locations.

Figure 10:
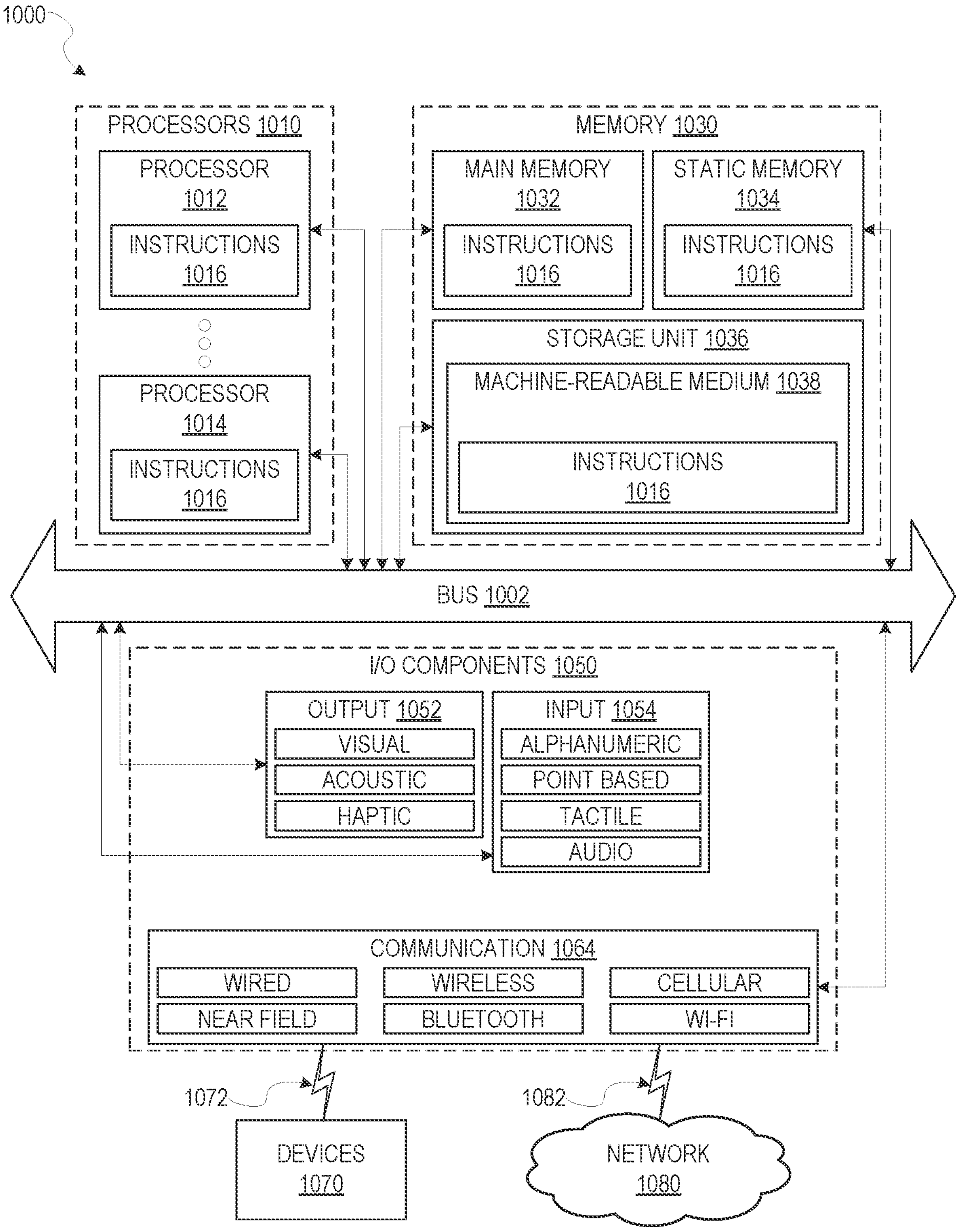
FIG. 10 is a diagram representing a machine in the form of a computer system within which a set of instructions are executed, causing the machine to perform any one or more of the methods discussed herein, according to some embodiments.

FIG. 10 is a diagrammatic representation of the machine 1000 in the form of a computer system within which a set of instructions may be executed for causing the machine 1000 to perform any one or more of the methodologies discussed herein, according to some embodiments. FIG. 10 shows components of the machine 1000, which is, according to some embodiments, able to read instructions from a machine-readable medium (e.g., a machine-readable storage medium) and perform any one or more of the methodologies discussed herein. Specifically, FIG. 10 shows a diagrammatic representation of the machine 1000 in the example form of a computer system, within which instructions 1016 (e.g., software, a program, an application, an applet, an app, or other executable code) for causing the machine 1000 to perform any one or more of the methodologies discussed herein can be executed. In alternative embodiments, the machine 1000 operates as a standalone device or can be coupled (e.g., networked) to other machines. In a networked deployment, the machine 1000 may operate in the capacity of a server machine or a client machine in a server-client network environment, or as a peer machine in a peer-to-peer (or distributed) network environment. The machine 1000 can comprise, but not be limited to, a server computer, a client computer, a personal computer (PC), a tablet computer, a laptop computer, a netbook, or any machine capable of executing the instructions 1016, sequentially or otherwise, that specify actions to be taken by the machine 1000. Further, while only a single machine 1000 is illustrated, the term "machine" shall also be taken to include a collection of machines 1000 that individually or jointly execute the instructions 1016 to perform any one or more of the methodologies discussed herein.

In various embodiments, the machine 1000 comprises processors 1010, memory 1030, and I/O components 1050, which can be configured to communicate with each other via a bus 1002. In some embodiments, the processors 1010 (e.g., a central processing unit (CPU), a reduced instruction set computing (RISC) processor, a complex instruction set computing (CISC) processor, a graphics processing unit (GPU), a digital signal processor (DSP), an ASIC, a radio-frequency integrated circuit (RFIC), another, or any suitable combination thereof) include, for example, a processor 1012 and a processor 1014 that may execute the instructions 1016. The term "processor" is intended to include multi-core processors 1010 that may comprise two or more independent processors 1012, 1014 (also referred to as "cores") that can execute the instructions 1016 contemporaneously. Although FIG. 10 shows multiple processors 1010, the machine 1000 may include a single processor 1012 with a single core, a single processor 1012 with multiple cores (e.g., a multi-core processor 1012), multiple processors 1010 with a single core, multiple processors 1010 with multiple cores, or any combination thereof.

The memory 1030 comprises a main memory 1032, a static memory 1034, and a storage unit 1036 accessible to the processors 1010 via the bus 1002, according to some embodiments. The storage unit 1036 can include a machine-readable medium 1038 on which are stored the instructions 1016 embodying any one or more of the methodologies or functions described herein. The instructions 1016 can also reside, completely or at least partially, within the main memory 1032, within the static memory 1034, within at least one of the processors 1010 (e.g., within the processor's cache memory), or any suitable combination thereof, during execution thereof by the machine 1000. Accordingly, in various embodiments, the main memory 1032, the static memory 1034, and the processors 1010 are considered machine-readable media 1038.

As used herein, the term "memory" refers to a machine-readable medium 1038 able to store data temporarily or permanently and may be taken to include, but not be limited to, random-access memory (RAM), read-only memory (ROM), buffer memory, flash memory, and cache memory. While the machine-readable medium 1038 is shown, in some embodiments, to be a single medium, the term "machine-readable medium" should be taken to include a single medium or multiple media (e.g., a centralized or distributed database, or associated caches and servers) able to store the instructions 1016. The term "machine-readable medium" shall also be taken to include any medium, or combination of multiple media, that is capable of storing instructions (e.g., the instructions 1016) for execution by a machine (e.g., the machine 1000), such that the instructions, when executed by one or more processors of the machine (e.g., the processors 1010), cause the machine to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" shall accordingly be taken to include, but not be limited to, one or more data repositories in the form of a solid-state memory (e.g., flash memory), an optical medium, a magnetic medium, other non-volatile memory (e.g., erasable programmable read-only memory (EPROM)), or any suitable combination thereof. The term "machine-readable medium" specifically excludes non-statutory signals per se.

The I/O components 1050 include a wide variety of components to receive input, provide output, produce output, transmit information, exchange information, capture measurements, and so on. In general, it will be appreciated that the I/O components 1050 can include many other components that are not shown in FIG. 10. The I/O components 1050 are grouped according to functionality merely for simplifying the following discussion, and the grouping is in no way limiting. In various embodiments, the I/O components 1050 include output components 1052 and input components 1054. The output components 1052 include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor), other signal generators, and so forth. The input components 1054 include alphanumeric input components (e.g., a keyboard, a touch screen configured to receive alphanumeric input, a photo-optical keyboard, or other alphanumeric input components), point-based input components (e.g., a mouse, a touchpad, a trackball, or other pointing instruments), tactile input components (e.g., a physical button, a touch screen that provides location and force of touches or touch gestures, or other tactile input components), audio input components (e.g., a microphone), and the like.

In some embodiments, outputs from an EDA computing device may include design documents, files for additional steps in a design flow, or outputs for circuit fabrication. As described herein, "constraints," "requirements," "design elements," and other aspects of a circuit design refer to selectable values that are set as part of the design of a circuit. Such design constraints, requirements, or elements may be adjusted by a system operator or circuit designer to suit the particular goals of a project or circuit that results from the operations described herein.

Communication can be implemented using a wide variety of technologies. The I/O components 1050 may include communication components 1064 operable to couple the machine 1000 to a network 1080 or devices 1070 via a coupling 1082 and a coupling 1072, respectively. For example, the communication components 1064 include a network interface component or another suitable device to interface with the network 1080. In further examples, the communication components 1064 include wired communication components, wireless communication components, cellular communication components, near field communication (NFC) components, BLUETOOTH® components (e.g., BLUETOOTH® Low Energy), WI-FI® components, and other communication components to provide communication via other modalities. The devices 1070 may be another machine or any of a wide variety of peripheral devices (e.g., a peripheral device coupled via a USB).

In various embodiments, one or more portions of the network 1080 can be an ad hoc network, an intranet, an extranet, a virtual private network (VPN), a local area network (LAN), a wireless LAN (WLAN), a wide area network (WAN), a wireless WAN (WWAN), a metropolitan area network (MAN), the Internet, a portion of the Internet, a portion of the public switched telephone network (PSTN), a plain old telephone service (POTS) network, a cellular telephone network, a wireless network, a WI-FI® network, another type of network, or a combination of two or more such networks. For example, the network 1080 or a portion of the network 1080 may include a wireless or cellular network, and the coupling 1082 may be a Code Division Multiple Access (CDMA) connection, a Global System for Mobile communications (GSM) connection, or another type of cellular or wireless coupling.

Furthermore, the machine-readable medium 1038 is non-transitory (in other words, not having any transitory signals) in that it does not embody a propagating signal. However, labeling the machine-readable medium 1038 "non-transitory" should not be construed to mean that the machine-readable medium 1038 is incapable of movement; the machine-readable medium 1038 should be considered as being transportable from one physical location to another. Additionally, since the machine-readable medium 1038 is tangible, the machine-readable medium 1038 may be considered to be a machine-readable device.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to some embodiments, various modifications and changes may be made to these embodiments without departing from the broader scope of embodiments of the present disclosure.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The detailed description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. The terms "a" or "an" should be read as meaning "at least one," "one or more," or the like. The use of words and phrases such as "one or more," "at least," "but not limited to," or other like phrases shall not be read to mean that the narrower case is intended or required in instances where such broadening phrases may be absent.

Boundaries between various resources, operations, components, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The description above includes systems, methods, devices, instructions, and computer media (e.g., computing machine program products) that embody illustrative embodiments of the disclosure. In the description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

What is claimed is:

1. A system comprising:

a memory storing instructions; and a hardware processor communicatively coupled to the memory and configured by the instructions to perform operations comprising:

accessing circuit design data that describes a circuit design comprising a clock tree, the clock tree comprising one or more clock nodes of the circuit design;

determining a critical path of the clock tree that has a longest insertion delay in the clock tree, the critical path passing through a critical clock node of the clock tree, the critical path being between a parent clock node of the critical clock node and a critical child clock node of the critical clock node;

determining a set of non-critical child clock nodes of the critical clock node;

determining, based on the set of non-critical child clock nodes, a possible transformation to be applied to the clock tree, the possible transformation being configured to reduce a load driven of the critical clock node, the possible transformation comprising at least one of:

one or more non-critical child clock node movements that move one or more non-critical child clock nodes of the set of non-critical child clock nodes closer to the critical clock node; or one or more non-critical child node size adjustments that downsize one or more non-critical child clock nodes of the set of non-critical child clock nodes;

determining, based on an outcome of the determining of the possible transformation, whether to apply the possible transformation to the clock tree; and in response to determining that the possible transformation is to be applied to the clock tree, modifying the circuit design to apply the possible transformation to the clock tree.

2. The system of claim 1, wherein at least one child node movement in the set of child node movements results in a reduction in an insertion delay of the critical path.

3. The system of claim 1, wherein at least one child node size adjustment in the set of child node size adjustments results in a reduction in an insertion delay of the critical path.

4. The system of claim 1, wherein the determining of the possible transformation comprises:

for each individual non-critical child clock node of the set of non-critical child clock nodes:

determining an ordered set of possible locations for the individual non-critical child clock node, the ordered set of possible locations comprising a predetermined number of possible locations, the ordered set of possible locations being ordered such that each subsequent possible location successively reduces a wirelength distance between the individual non-critical child clock node and the critical clock node; and performing a non-critical child node movement iteration for an i-th time, the non-critical child node movement iteration comprising:

applying a set of non-critical child node movements to the clock tree that cause each select non-critical child clock node in the set of non-critical child clock nodes to move, from a current location of the select non-critical child clock node, to an i-th possible location in the ordered set of possible locations of the select non-critical child clock node.

5. The system of claim 4, wherein the non-critical child node movement iteration comprises:

determining whether the set of non-critical child node movements results in a reduction of an insertion delay of the critical path; and in response to determining that the set of non-critical child node movements results in the reduction of the insertion delay of the critical path, updating the possible transformation with the set of non-critical child node movements.

6. The system of claim 5, wherein the non-critical child node movement iteration comprises:

performing the non-critical child node movement iteration for an i+I-th time.

7. The system of claim 4, wherein the non-critical child node movement iteration comprises:

determining whether the set of non-critical child node movements results in a first reduction of an insertion delay of the critical path; and in response to determining that the set of non-critical child node movements does not result in the first reduction of the insertion delay of the critical path, performing a non-critical child node resize iteration that comprises:

applying a set of non-critical child node size adjustments to the clock tree that cause at least one non-critical child clock node in the set of non-critical child clock nodes to be downsized;

determining whether the set of non-critical child node size adjustments results in a second reduction of the insertion delay of the critical path; and in response to determining that the set of non-critical child node size adjustments results in the second reduction of the insertion delay of the critical path, updating the possible transformation with the set of non-critical child node size adjustments.

8. The system of claim 4, wherein the non-critical child node movement iteration comprises:

determining whether the set of non-critical child node movements results in a first reduction of an insertion delay of the critical path; and in response to determining that the set of non-critical child node movements does not result in the first reduction of the insertion delay of the critical path, performing a non-critical child node resize iteration that comprises:

applying a set of non-critical child node size adjustments to the clock tree that cause at least one non-critical child clock node in the set of non-critical child clock nodes to be downsized;

determining whether the set of non-critical child node size adjustments results in a second reduction of the insertion delay of the critical path; and in response to determining that the set of non-critical child node size adjustments does not result in the second reduction of the insertion delay of the critical path, performing the non-critical child node resize iteration for a subsequent time to further downsize at least one non-critical child clock node in the set of non-critical child clock nodes.

9. The system of claim 4, wherein the determining of the ordered set of possible locations for the individual non-critical child clock node comprises:

determining a bounding box that contains the critical clock node and the individual non-critical child clock node; and determining, based on the bound box, the ordered set of possible locations for the individual non-critical child clock node.

10. A non-transitory computer-readable medium comprising instructions that, when executed by a hardware processor of a device, cause the device to perform operations comprising:

accessing circuit design data that describes a circuit design comprising a clock tree, the clock tree comprising one or more clock nodes of the circuit design;

determining a set of non-critical child clock nodes of a critical clock node, the critical clock node being on a critical path of the clock tree, the critical path being between a parent clock node of the critical clock node and a critical child clock node of the critical clock node, the critical path having a longest insertion delay in the clock tree;

determining, based on the set of non-critical child clock nodes, a possible transformation to be applied to the clock tree, the possible transformation being configured to reduce a load driven of the critical clock node, the possible transformation comprising at least one of:

one or more non-critical child node movements that move one or more non-critical child clock nodes of the set of non-critical child clock nodes closer to the critical clock node; or one or more non-critical child node size adjustments that downsize one or more non-critical child clock nodes of the set of non-critical child clock nodes;

determining, based on an outcome of the determining of the possible transformation, whether to apply the possible transformation to the clock tree; and in response to determining that the possible transformation is to be applied to the clock tree, modifying the circuit design to apply the possible transformation to the clock tree.

11. The non-transitory computer-readable medium of claim 10, wherein at least one child node movement in the set of child node movements results in a reduction in an insertion delay of the critical path.

12. The non-transitory computer-readable medium of claim 10, wherein at least one child node size adjustment in the set of child node size adjustments results in a reduction in an insertion delay of the critical path.

13. The non-transitory computer-readable medium of claim 10, wherein the determining of the possible transformation comprises:

for each individual non-critical child clock node of the set of non-critical child clock nodes:

determining an ordered set of possible locations for the individual non-critical child clock node, the ordered set of possible locations comprising a predetermined number of possible locations, the ordered set of possible locations being ordered such that each subsequent possible location successively reduces a wirelength distance between the individual non-critical child clock node and the critical clock node; and performing a non-critical child node movement iteration for an i-th time, the non-critical child node movement iteration comprising:

applying a set of non-critical child node movements to the clock tree that cause each select non-critical child clock node in the set of non-critical child clock nodes to move, from a current location of the select non-critical child clock node, to an i-th possible location in the ordered set of possible locations of the select non-critical child clock node.

14. The non-transitory computer-readable medium of claim 13, wherein the non-critical child node movement iteration comprises:

determining whether the set of non-critical child node movements results in a reduction of an insertion delay of the critical path; and in response to determining that the set of non-critical child node movements results in the reduction of the insertion delay of the critical path, updating the possible transformation with the set of non-critical child node movements.

15. The non-transitory computer-readable medium of claim 14, wherein the non-critical child node movement iteration comprises:

performing the non-critical child node movement iteration for an i+I-th time.

16. The non-transitory computer-readable medium of claim 13, wherein the non-critical child node movement iteration comprises:

determining whether the set of non-critical child node movements results in a first reduction of an insertion delay of the critical path; and in response to determining that the set of non-critical child node movements does not result in the first reduction of the insertion delay of the critical path, performing a non-critical child node resize iteration that comprises:

applying a set of non-critical child node size adjustments to the clock tree that cause at least one non-critical child clock node in the set of non-critical child clock nodes to be downsized;

determining whether the set of non-critical child node size adjustments results in a second reduction of the insertion delay of the critical path; and in response to determining that the set of non-critical child node size adjustments results in the second reduction of the insertion delay of the critical path, updating the possible transformation with the set of non-critical child node size adjustments.

17. The non-transitory computer-readable medium of claim 13, wherein the non-critical child node movement iteration comprises:

determining whether the set of non-critical child node movements results in a first reduction of an insertion delay of the critical path; and in response to determining that the set of non-critical child node movements does not result in the first reduction of the insertion delay of the critical path, performing a non-critical child node resize iteration that comprises:

applying a set of non-critical child node size adjustments to the clock tree that cause at least one non-critical child clock node in the set of non-critical child clock nodes to be downsized;

determining whether the set of non-critical child node size adjustments results in a second reduction of the insertion delay of the critical path; and in response to determining that the set of non-critical child node size adjustments does not result in the second reduction of the insertion delay of the critical path, performing the non-critical child node resize iteration for a subsequent time to further downsize at least one non-critical child clock node in the set of non-critical child clock nodes.

18. The non-transitory computer-readable medium of claim 13, wherein the determining of the ordered set of possible locations for the individual non-critical child clock node comprises:

determining a bounding box that contains the critical clock node and the individual non-critical child clock node; and determining, based on the bound box, the ordered set of possible locations for the individual non-critical child clock node.

19. A method comprising:

accessing, by a hardware processor, circuit design data that describes a circuit design comprising a routing tree, the routing tree comprising one or more nodes of the circuit design, determining, by the hardware processor, a set of non-critical child nodes of a critical node, the critical node being on a critical path of the routing tree, the critical path being between a parent node of the critical node and a critical child node of the critical node, the critical path having a longest insertion delay in the routing tree;

determining, by the hardware processor, a possible transformation to the routing tree based on the set of non-critical child nodes, the possible transformation being configured to reduce a load driven by the critical node, the possible transformation comprising at least one of:

one or more non-critical child node movements that move one or more non-critical child nodes of the set of non-critical child nodes closer to the critical node; or one or more non-critical child node size adjustments that downsize one or more non-critical child nodes of the set of non-critical child nodes;

determining, by the hardware processor and based on an outcome of the determining of the possible transformation, whether to apply the possible transformation to the routing tree; and in response to determining that the possible transformation is to be applied to the routing tree, modifying, by the hardware processor, the circuit design to apply the possible transformation to the routing tree.

20. The method of claim 19, wherein the determining of the possible transformation comprises:

for each individual non-critical child node of the set of non-critical child nodes:

determining an ordered set of possible locations for the individual non-critical child node, the ordered set of possible locations comprising a predetermined number of possible locations, the ordered set of possible locations being ordered such that each subsequent possible location successively reduces a wirelength distance between the individual non-critical child node and the critical node; and performing a non-critical child node movement iteration for an i-th time, the non-critical child node movement iteration comprising:

applying a set of non-critical child node movements to the routing tree that cause each select non-critical child node in the set of non-critical child nodes to move, from a current location of the select non-critical child node, to an i-th possible location in the ordered set of possible locations of the select non-critical child node.

* * * * *